United States Patent
Yero

[19]

[11] Patent Number: 6,140,876
[45] Date of Patent: Oct. 31, 2000

[54] DIFFERENTIAL AMPLIFIER WITH MOS TRANSISTOR

[75] Inventor: Emilio Yero, Aix en Provence, France

[73] Assignee: STMicroelectronics S.A., Gentilly, France

[21] Appl. No.: 09/188,071

[22] Filed: Nov. 6, 1998

[30] Foreign Application Priority Data

Nov. 7, 1997 [FR] France ................ 97 14018

[51] Int. Cl.⁷ .................................. H03F 3/45
[52] U.S. Cl. ............... 330/253; 330/259; 330/261
[58] Field of Search ................ 330/253, 259, 330/261

[56] References Cited

U.S. PATENT DOCUMENTS

| | | | |
|---|---|---|---|
| 4,213,098 | 7/1980 | Tsividis | 330/253 |
| 4,371,843 | 2/1983 | Fang et al. | 330/253 |
| 4,538,114 | 8/1985 | Kunimi et al. | 330/253 |
| 4,616,189 | 10/1986 | Pengue, Jr. | 330/253 |
| 5,182,525 | 1/1993 | Theus | 330/253 |
| 5,422,529 | 6/1995 | Lee | 330/253 X |
| 5,451,901 | 9/1995 | Welland | 330/133 |
| 5,475,339 | 12/1995 | Maida | 327/561 |
| 5,777,514 | 7/1998 | Mittal et al. | 330/253 |
| 5,831,327 | 11/1998 | Kimura | 327/563 |

FOREIGN PATENT DOCUMENTS 05-16423  12/1992  European Pat. Off. .

OTHER PUBLICATIONS

French Search Report (Jul. 2, 1998).
European Search Report dated Feb. 23, 1999.

*Primary Examiner*—Steven J. Mottola
*Attorney, Agent, or Firm*—Theodore E. Galanthay; Stephen Bongini; Fleit, Kain, Gibbons, Gutman & Bongini P. L.

[57] ABSTRACT

In a differential amplifier with asymmetrical outputs, the gates of the two load transistors are at the same specified potential and the voltage at the connection node between the load transistor and the amplifier transistor of one arm is stabilized by means of a compensation structure. This amplifier works at low VCC (e.g., less than 2 volts) while at the same time having high gain.

21 Claims, 3 Drawing Sheets

6,140,876

DIFFERENTIAL AMPLIFIER WITH MOS TRANSISTOR

CROSS-REFERENCE TO RELATED APPLICATIONS

This application is based upon and claims the benefit of the priority of prior French patent application 97-14018 filed on Nov. 7, 1997, the contents of which are herein incorporated by reference.

BACKGROUND OF THE INVENTION

1. Field of the Invention

The present invention relates to a differential amplifier using MOS transistors.

2. Discussion of Related Art

Differential amplifiers are used in many integrated circuits. The present invention is concerned more particularly with amplifiers that have only one stage, having high gain like those used especially in circuits for reading non-volatile memories. For this type of application, it is common practice to use differential amplifiers with asymmetrical outputs. The active load used to this end by these differential amplifiers is a current mirror structure.

While these differential amplifiers with asymmetrical outputs are widely used, it has been observed, however, that they do not work very well at an excessively low logic supply voltage VCC. Indeed, it is known that technological efforts are being made particularly to reduce the level of the logic supply voltage of the integrated circuits. It has been sought in particular to make these circuits work at 2 volts or even 1 volt. Now, with a current mirror assembly, there is a transistor mounted as a diode. This leads to a systematic drop in a transistor voltage threshold, of about 0.8 volts for a P type transistor. With a logic supply voltage VCC of 2 volts, this amounts to a drop in voltage by nearly half. It will be understood therefore that this voltage drop inherent in the structure of this amplifier is a real factor of limitation at low VCC.

It is an object of the present invention to resolve this technical problem of limitation at low VCC, while maintaining high gain.

For a clearer understanding of the nature of the technical problem to be resolved, FIG. 1 shows a drawing of a known differential amplifier using MOS transistors. This differential amplifier is used especially in non-volatile memory read circuits to compare the voltage on a bit line with a reference voltage. Even if not specifically mentioned, all of the transistors in the following description of the preferred embodiment are metal-oxide semiconductor (MOS) transistors.

The differential amplifier has a first arm (also called a branch) and a second arm that are parallel-connected on the one hand to a first supply voltage and on the other hand to a bias transistor M5. This bias transistor M5 is connected to a second supply voltage and receives a bias potential at its gate. Each arm has a load transistor M1 or M2 and an amplifier transistor M3 or M4 that are series-connected. The load transistors are mounted as a current mirror. The transistor M1 is mounted as a diode (with the gate and drain connected). The point of connection between the load transistor M1 and the amplifier transistor M3 is referenced A, and is at the potential VA. The point of connection between the load transistor M2 and the amplifier transistor M4 is the output OUT of the amplifier. The two inputs, namely the positive input E1 and the negative input E2, of this differential amplifier with asymmetrical outputs are formed respectively by the gate of the transistor M3 and the gate of the transistor M4. The two voltages to be compared are applied to them, these voltages being conventionally referenced $V_+$ for E1 and $V_-$ for E2.

The example has been described in the context of CMOS technology. The MOS transistor M1 is thus a P type transistor and is connected as a forward-biased diode with its gate connected to its drain. Its source is connected to the supply voltage VCC. Its drain is connected to the drain of the MOS transistor M3 which is an N type transistor. The MOS load transistor M2 too is a P type transistor and its gate is connected to the gate of the transistor M1 (mounted as a diode). Its source is connected to the voltage VCC. Its drain is connected to the drain of the N type transistor M4.

The sources of the transistors M3 and M4 are connected together, at a point referenced S, to the drain of the N type current bias transistor M5.

In the example, the amplifier transistors M3 and M4 are native transistors, namely they have a very low threshold voltage $V_{tn}$, which is represented by an additional stroke in the drawing.

In the exemplary use of this amplifier in a read circuit for a memory, one of the inputs of the comparator, in the example the input E1, has the voltage BL of a bit line of the memory (the bit line that is being read) and the other input, in the example E2, has the reference read voltage VREF. In an application of this kind, the inputs BL and VREF have a maximum voltage level of 1 volt.

The ideal operation of a comparator of this kind follows the characteristic curve defined as follows:

IF $V_+-V_->0$ THEN VOUT=VCC AND
IF $V_+-V_-<0$ THEN VOUT=GND.

This ideal characteristic has an infinite gain when $V_+=V_-$.

Under real conditions of operation, there is a high gain in the region of $V_+=V_-$. If this gain is referenced K, the corresponding curve is the one shown in FIG. 2, defined as follows:

IF $V_+-V_->\epsilon$ THEN VOUT=VCC AND
IF $V_+-V_-<-\epsilon$ THEN VOUT=GND
IF $-\epsilon<V_+-V_-<+\epsilon$
THEN VOUT=$K(V_+-V_-)+VCC/2$.

In order that this function may be continuous, we must have the following as relationships:

$$K*\epsilon=VCC/2, \text{ that is} \qquad (1)$$

$$2*\epsilon=VCC/K. \qquad (2)$$

These relationships (1) or (2) clearly show that the higher the gain, the narrower is the critical zone between $-\epsilon$ and $+\epsilon$ where the output voltage VOUT is neither VCC nor GND the higher the gain, the closer we come to ideal characteristic curve.

It is therefore very important to have optimum gain, namely the greatest possible gain. This is why all the transistors M1 to M4 of the amplifier must work in saturated mode, especially in the critical zone $[-\epsilon; +\epsilon]$.

Hereinafter, it will be shown that this condition can be achieved in the prior art circuit only for a supply voltage of over 2 volts, on the basis of the typical values in a given CMOS technology.

The zone with which the present invention is concerned more particularly is the critical zone $[-\epsilon; +\epsilon]$, corresponding to the switching-over of the output VOUT of the amplifier. It is at this point in time that the greatest possible gain is needed.

In the following computations, it is assumed that $V_+=V_-$, with transistors M1 to M5 in saturated mode. The transistors M1 and M2 are identical and the transistors M3 and M4 are identical.

At a first stage, a computation will be made of the value of the small-signal gain in differential mode K of an amplifier of this kind, assuming that $V_+=V_-$ and assuming that around this point $\Delta V_+ = -\Delta V_-$ It is assumed that VS is constant. Furthermore, the following notational conventions are adopted:

- $g_{Mi}$ is the gain of the transistor Mi in saturated mode ($g_{+Mi} = m_0 C_{OX} W/2L$);
- $V_{tn}$ is the threshold voltage of an N type MOS transistor (M5);
- $V_{tw}$ is the threshold voltage of a native N type MOS transistor (M3 or M4);
- $V_{tp}$ is the threshold voltage of a P type MOS transistor (M1, M2);
- VDF is the differential input voltage equal to $(V_+ - V_-)/2$;
- K is the gain in differential mode, equal to $\Delta V_{OUT}/\Delta V_{DF}$;
- $G_{mi}$ is the small-signal transconductance for the transistor Mi, equal to $\delta I_{DS}/\epsilon V_{GS}$; and
- $r_{OMi}$ is the drain saturation resistance of the transistor Mi due to the modulation of the width of the channel.

The current variation in the arm (M1, M3) is: $\Delta I_{M3} = G_{M3} \cdot \Delta V_+$.

Since this current flows in the arm (M2, M4) through the current mirror formed by the transistors M1 and M2, the current variation in this arm is: $\Delta I_{M2} = \Delta I_{M3} = G_{M3} \cdot \Delta V_+$.

Since $G_{M3} = G_{M4}$ (identical transistors) and $\Delta V_+ = -\Delta V_-$ (differential mode), we have:

$$\Delta I_{M2} = -\Delta I_{M4}.$$

The output current is:

$$\Delta I_{M2} - \Delta I_{M4} = 2\Delta I_{M2} = 2\Delta I_{M3} = 2G_{M3}\Delta V_+ = 2G_{M4}\Delta V_+.$$

This current flows into the equivalent output resistor (in small signals) corresponding to the saturation resistance $r_{OM2}$ of the transistor M2 in parallel with the saturation resistance $r_{OM4}$ of the transistor M4. The variation in the output voltage is therefore:

$$\Delta VOUT = 2G_{M4}\Delta V_+ (r_{OM2} // r_{OM4}).$$

With $\Delta VDF = (\Delta V_+ - \Delta V_-)/2 = \Delta V_+$, the value of the gain in differential mode is deduced therefrom:

$$K = \Delta VOUT/\Delta VDF = 2G_{M4}\Delta V_+ (r_{OM2} // r_{OM4}).$$

A search shall now be made for the condition, with the respect to the supply voltage VCC, that enables the transistors to be really in saturation mode.

The current I3 flowing into the transistor M3 and the current I4 flowing into the transistor M4 are equal and given by the following relationship in saturated mode:

$$I3 = I4 = g_{M3}(V_+ - V_- - V_{tw})^2. \tag{a}$$

If the transistor M3 is saturated, we also have the following relationship (b):

$$V_A > V_+ - V_{tw}. \tag{b}$$

The current I1 in the transistor M1 and the current I2 in the transistor M2 are equal and given by the following relationship (c):

$$I1 = I2 = g_{M1}(VCC - VA - V_{tp})^2. \tag{c}$$

Since the transistors M1 and M2 are series-connected, we have I1=I3, and therefore:

$$g_{M1}(VCC - VA - V_{tp})^2 = g_{M3}(V_+ - V_- - V_{tw})^2. \tag{d}$$

If we write $y = (g_{M3}/g_{M1})$, we therefore have:

$$VA = VCC - V_{tp} - y(V_+ - VS - V_{tw}). \tag{e}$$

In the relationship (b) of saturation of the transistor M3, we get:

$$VCC - V_{tp} - y(V_+ - VS - V_{tw}) > V_+ - V_{tw}.$$

It is therefore necessary, in order to fulfil the saturation condition, that the supply voltage VCC should be such that:

$$VCC > (y+1)(V_+ - V_{tw}) + V_{tp} - yVS.$$

With the following typical values: $V_{tp}=0.8$ volt; y=1; $V_{tw}=0.4$ volt; VS=0.2 volt and for an application of the memory read circuit type, in which there will be $V_+=1$ volt, it is therefore necessary that VCC>1.8 volts to ensure the saturation condition of the transistors.

In practice, for circuits supplied with VCC equal to 2 volts in nominal voltage, the working of the circuit must be guaranteed up to at least 1.6 volts. It can be seen that the condition of saturation is no longer fulfilled at this value. It is therefore not possible to contemplate the use of this circuit at less than VCC=3 volts.

To ensure the condition of saturation at a lower VCC, the value of the ratio y between the gains of the transistors M1 and M3 could be reduced. However, for VCC=1.6 volts, we must have y=0.25. In practice, this means that the P type transistor M1 should have eight times the gain of the N type native transistor M3. Since in addition the gain per unit of width of a P type transistor is equal to half that of a native transistor, this means that in fact there should be a size ratio of 16 to 1 between the P type transistor M1 and the native transistor M3. A transistor M1 of such a large size imposes major constraints of design and increases the parasitic charges. This implies a reduction in switching speed. This approach therefore is not acceptable.

Another way to succeed in obtaining this inequality is to change the technology, so as to have transistor threshold voltages ($V_{tw}$ and $V_{tp}$) that are even lower. This approach is not valuable because, if the threshold voltages are reduced, the sub-threshold leakage currents are necessarily increased. This is particularly troublesome for so-called portable applications, using battery-powered integrated circuits.

In the present invention, another way has been sought to ensure the condition of saturation, even at low logic supply voltage VCC, while at the same time keeping the gain of this amplifier.

SUMMARY OF THE INVENTION

Briefly, according to the present invention, a differential amplifier comprises a first supply voltage terminal, a second supply voltage terminal, a first branch, a second branch, and a bias transistor. The first branch comprises a first load transistor and a first amplifier transistor which are series connected. The second branch comprises a second load transistor and a second amplifier transistor which are series connected. The second branch is parallel connected with the first branch between the first supply voltage terminal and a bias node. The bias transistor is coupled between the bias node and the second supply voltage terminal. The gates of the first load transistor and of the second load transistor are biased to a same specified potential. The differential amplifier also includes a stabilizing circuit for the potential at the connection point between the first load transistor and the first amplifier transistor. In a first embodiment of the present invention, the stabilizing circuit includes a compensation transistor that is connected in parallel with the bias transistor. In a second embodiment, the stabilizing circuit includes a first compensation transistor connected between the first supply terminal and the connection point and a second compensation transistor, which is connected between the first supply terminal and the output node between the second load transistor and the second amplifier transistor.

Other objects, features, and advantages of the present invention will become apparent from the following detailed description. It should be understood, however, that the detailed description and specific examples, while indicating preferred embodiments of the present invention, are given by way of illustration only and various modifications may naturally be performed without deviating from the present invention.

DETAILED DESCRIPTION OF PREFERRED EMBODIMENTS

Figure 1:
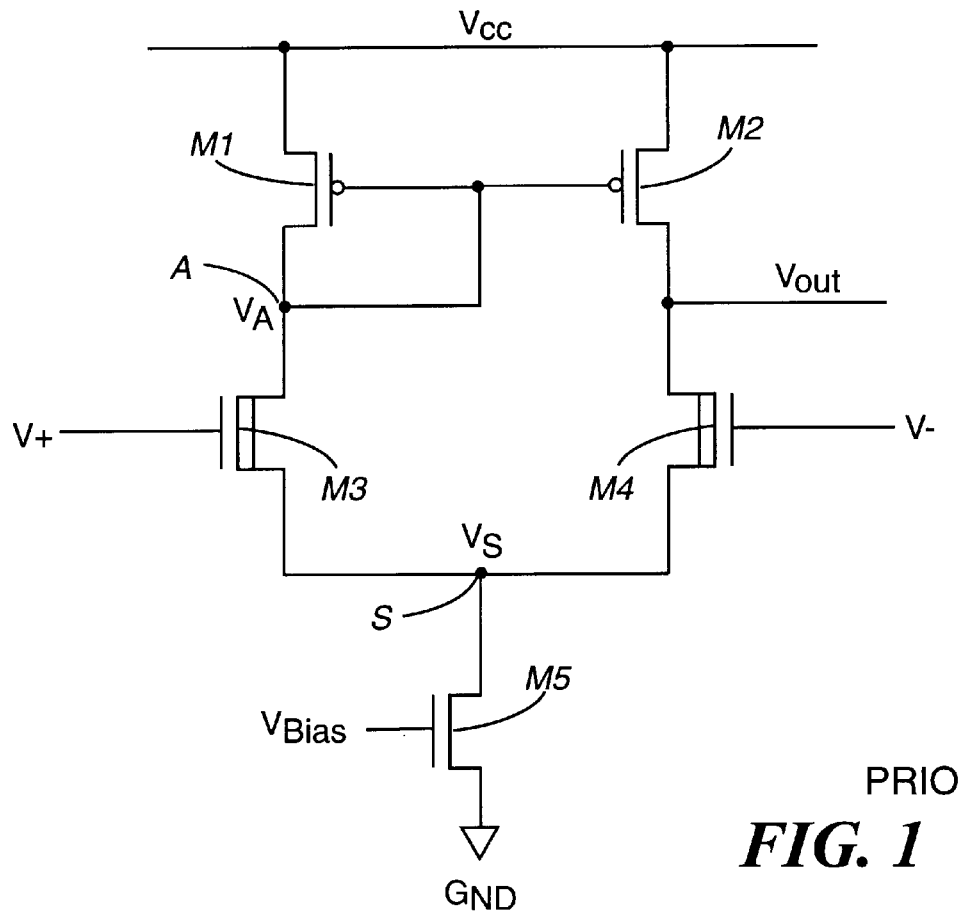
FIG. 1 shows a prior differential amplifier circuit with current mirror.
Figure 2:
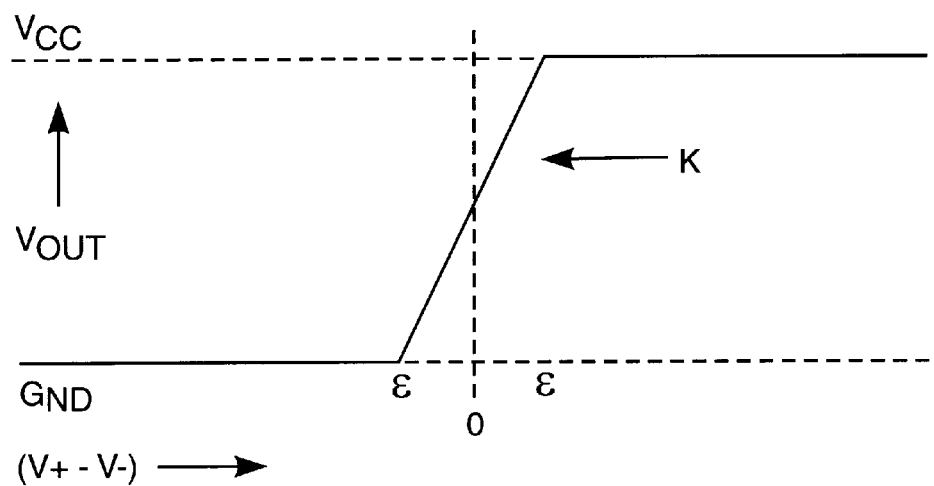
FIG. 2 shows the characteristic response curve of an amplifier of this kind.

Preferred embodiments of the present invention will be described in detail hereinbelow with reference to the attached drawing. The same elements in FIGS. 1, 3, and 4 bear the same references. Because FIG. 1 has already been described, we will describe the new elements of FIGS. 3 and 4.

One approach to the technical problem of the prior art has been found in an amplifier with symmetrical outputs in which the gates of the load transistors are biased at one and the same specified potential. There are then two current sources as such and the currents vary in the same way in both arms. This means that if there is a variation $\Delta i$ in one arm, there will be a variation $\Delta i$ in the other arm, giving $2*\Delta i$ in all. The gain is therefore divided by two. For this reason, the amplifier also includes a circuit to stabilize the voltage VA at the midpoint A of the arm (M1, M3). The stabilizing circuit of embodiments of the present invention will absorb the current variation.

Figure 3:
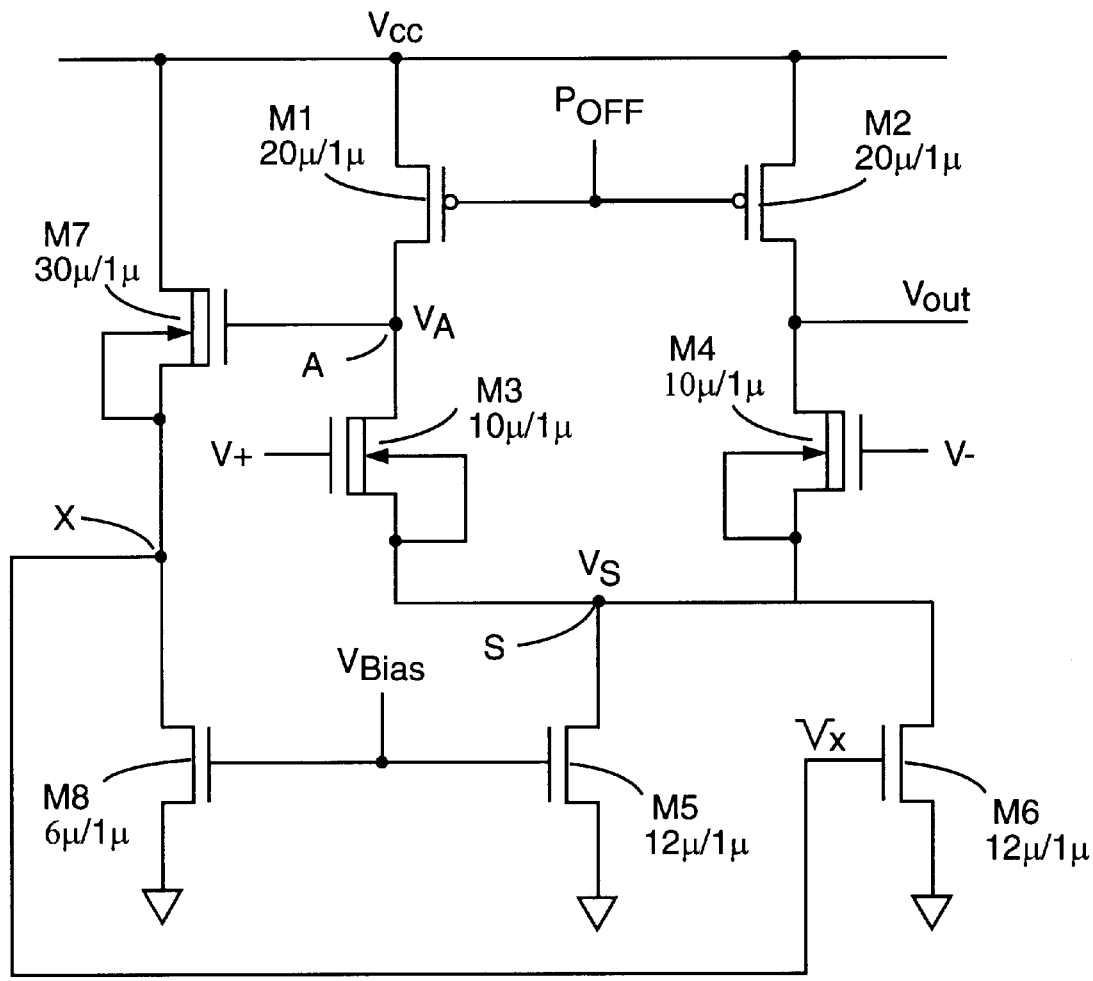
FIG. 3 shows a differential amplifier circuit according to a first embodiment of the present invention.

In the amplifier according to a first embodiment of the present invention shown in FIG. 3, the load transistors M1 and M2 are no longer mounted as current mirrors. They have only their gates connected together. These gates are now biased by a bias voltage referenced POFF. This makes sure that the two arms of the amplifier are symmetrical in common mode. This bias voltage is in principle generated internally by the integrated circuit comprising the amplifier.

According to the first embodiment of the present invention as shown in FIG. 3, the stabilizing circuit includes a compensation transistor M6 that is parallel-connected with the bias transistor M5 to absorb the current variation. MOS transistors M5 and M6 are of the same type, the N type in the example. The compensation transistor M6 is controlled on its gate by a dynamic bias circuit that includes a transistor M7 and a transistor M8 series-connected between the supply voltage VCC and ground. The transistor M7 is of the same type as the transistor M3. In the example, it is an N type, native transistor. It has its gate controlled by the node A. The transistor M8 is of the same type as the transistor M5. In the example, it is an N type transistor. It is weakly conductive and controlled at its gate by the bias voltage VBIAS. The midpoint X of the series-connection (M7, M8) provides for the control voltage Vx applied to the gate of the compensation transistor M6.

A stabilizing circuit of this kind, as shall be shown, makes the amplifier perform very well at low supply voltage. It enables the saturation condition to be maintained on the transistors while, at the same time, preserving the gain of the prior art amplifier with current mirror.

First of all, a circuit of this kind according to the present invention works as follows. The load transistors M1 and M2 are identical. The amplifier transistors M3 and M4 are identical. If $V_+=V_-$, we have the same current in both arms. This current is referenced $I+\Delta I$, $\Delta I$ being a function of the variation in potential at the node A.

At S, the current to be absorbed is therefore $2I+2\Delta I$. The fixed component $2I$ is absorbed by the bias transistor M5. The transistor M6 is used to absorb the variable component $2\Delta I$.

The assembly M6, M7, M8 fulfils a function of compensation (by negative feedback) of the potential variation at the node A. Let it be assumed that the potential VA tends to increase. The transistor M7 then becomes more conductive, and the transistor M8 too (M8 being weakly conductive). Since the gate voltage of the transistor M8 is fixed (VBIAS), it is the potential at the midpoint of the connection X between the two transistors that rises, making the transistor M6 more conductive. This transistor therefore draws more current, tending to increase the component $\Delta I$ in the arm (M1, M3). The potential VA of the node A therefore tends to diminish. A similar reasoning for a reverse variation of VA leads to the same result. Thus compensation is obtained for the variations. The potential VA is therefore stabilized through the compensation structure according to the present invention (M6, M7, M8). This enables the losses on the gain to be limited.

It will be shown that, in the critical zone with which the present invention is concerned, the gain is identical to that of the current mirror structure of the prior art and that the saturation condition of the new structure furthermore enables the bottom limit of VCC to be reduced.

Let us begin with the computation of the gain in differential mode by assuming the same conditions of computation as above.

The current in M1 is fixed since its gate is at POFF, its source is at VCC and its drain is at VA which is stabilized. Hence, the current in the transistor M3 is fixed.

This means that, if there is a variation $\Delta V_+$ at the input E1, this variation will be transferred to VS.

We therefore have $\Delta V_+=\Delta VS$.

Since the gain in differential mode is being considered, we also have: $\Delta V_+=-\Delta V_-$ The current variation in the arm (M2, M4) is therefore:

$$\Delta I_{M4} = G_{M4}(\Delta V_- - \Delta VS) = -2G_{M4}(\Delta V_+).$$

The current at the output node is:

$$\Delta I_{M2} - \Delta I_{M4} = -\Delta I_{M4},$$

for the current in the transistor M2 is stable ($\Delta I_{M2}=0$). We therefore have:

$$\Delta VOUT = -\Delta I_{M4}(r_{OM2}//r_{OM4})$$

$$\Delta VOUT = 2G_{M4}(\Delta V_+)(r_{OM2}//r_{OM4})$$

$$\Delta VOUT = 2(\Delta V_{DF})G_{M4}(r_{OM2}//r_{OM4})$$

giving therefore $$K = \Delta VOUT/\Delta V_{DF} = 2G_{M4}(r_{OM2}//r_{OM4})$$

There is therefore the same value of gain as in the prior art circuit with current mirror (asymmetrical outputs).

The condition of saturation of the transistors shall now be considered.

The condition of saturation on the transistor M1 gives the relationship:

$$VCC - POFF - V_{tp} < VCC - VA, \text{ giving } VA < POFF + V_{tp}. \quad (3)$$

The condition of saturation on the transistor M3 gives the relationship:

$$VA > V_+ - V_{tn} \text{ or } V_+ < VA + V_{tn}.$$

Now the potential VA is fixed by the transistors M6 and M7. Thus VA is equal to the drop in gate-source voltage of these transistors, that is:

$$VA = V_{tn} + V_{tn} = 1.2 \text{ volts.}$$

With typical values of VBIAS (200 mv) and taking $POFF + V_{tp} = VCC - VBIAS$, the conditions of saturation (3) and (4) are therefore always fulfilled at VCC=1.4 volts.

It is now possible to understand the full value of the circuit of the present invention which can be used to preserve the same gain as an amplifier with asymmetrical outputs while enabling work at low VCC, without yielding any advantages as regards current leakage or the speed of the circuit.

In practice, it is seen to it that the transistor M6 is always slightly conductive. For example, VBIAS and POFF are chosen so that each of the load transistors lets through a current of about 7.5 micro-amperes and so that the transistor M5 lets through only 10 micro-amperes. In this way, since there are 15 micro-amperes (2 times 7.5) to be let through to the node S, the transistor M6 lets through the remaining 5 micro amperes. In this way, the transistor M6 is always slightly conductive, and it is the voltage Vx which, on this basis, acts on the transistor depending on whether there is a greater or smaller amount of excess current.

Figure 4:
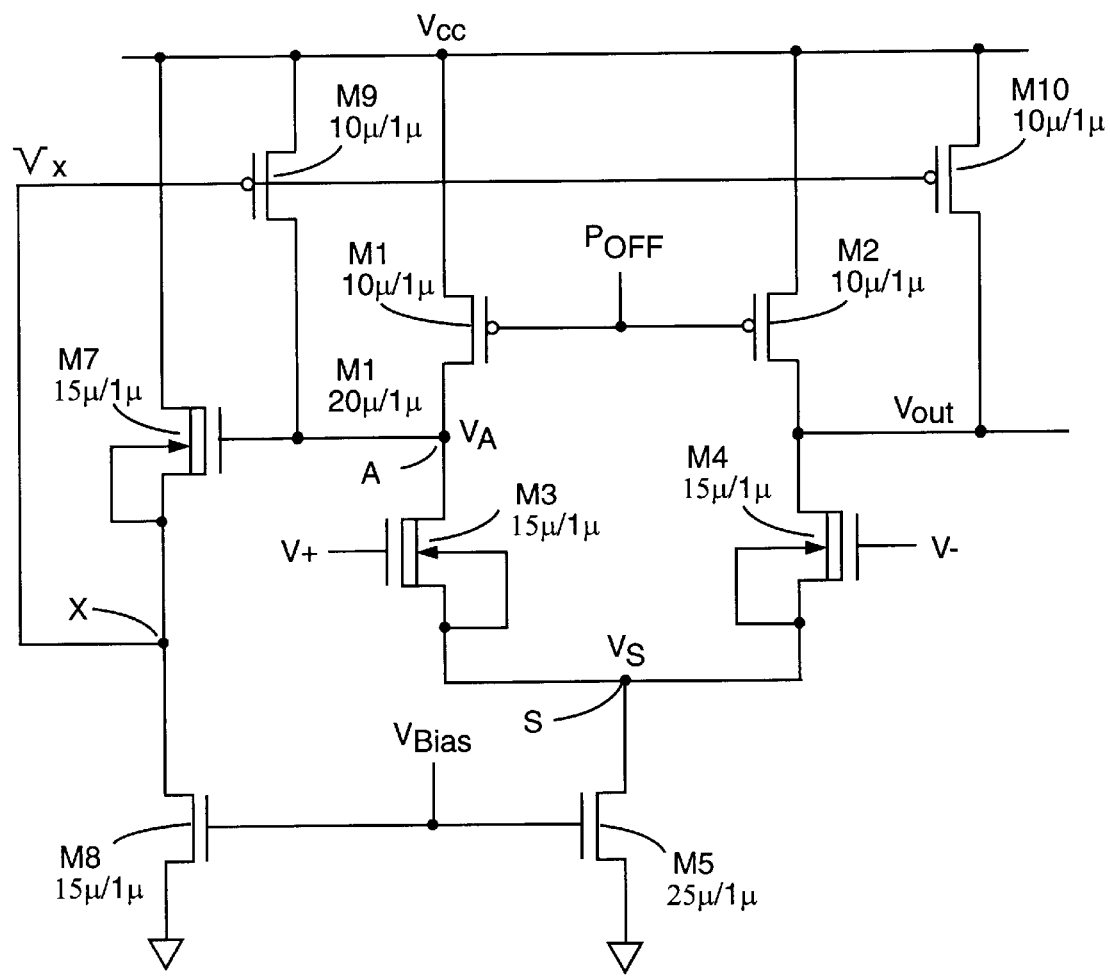
FIG. 4 shows a differential amplifier circuit according to a second embodiment of the present invention.

FIG. 4 shows a differential amplifier circuit according to a second embodiment of the present invention. As explained above, elements in FIG. 4 bear the same references as like elements in FIG. 3. In the second embodiment, the stabilizing circuit includes two compensation transistors M9 and M10 that absorb the current variation. The first compensation transistor M9 is connected between the supply voltage $V_{CC}$ and the node A, and the second compensation transistor is connected between the supply voltage $V_{CC}$ and the output VOUT of the amplifier. Preferably, the compensation transistors M9 and M10 are P-type MOS transistors as shown in FIG. 4. The two compensation transistors are made to always be weakly conductive, as was explained above with respect to the compensation transistor M6 of the first embodiment. Further, the two compensation transistors are controlled by the same gate control potential Vx, which is provided by a dynamic bias circuit. In the embodiment of FIG. 4, the dynamic bias circuit is illustratively shown to be the same as the bias circuit of the first embodiment of FIG. 3. In the second embodiment, the stabilizing circuit operates according to the same principles explained above with respect to the first embodiment. While the stabilizing circuit of the second embodiment enables a more direct control than in the first embodiment because the transistor M9 is directly connected to the potential to stabilize, the second embodiment requires the additional compensation transistor M10 to maintain symmetry in the amplifier. Further, in preferred embodiments, the technology used allows isolation of wells of N transistors (e.g., using triple wells technology), so the substrate's effect can be canceled by connecting the bulk to the source of each of the N transistors M3, M4, and M7, as is shown in FIGS. 3 and 4. This minimizes the threshold voltage to improve the functioning of the amplifier at low voltage.

Throughout this patent application, the terms coupled and connected include not only direct connections, but also connections with a coupling element disposed between the two "coupled" or "connected" devices, elements, etc. Coupling elements include, but are not limited to, resistors, decoupling capacitors, switches, and inverters. Additionally, a terminal in a circuit includes, but is not limited to, a point, trace, plane, or any other type of node or intersection.

While there has been illustrated and described what are presently considered to be the preferred embodiments of the present invention, it will be understood by those skilled in the art that various other modifications may be made, and equivalents may be substituted, without departing from the true scope of the invention. Additionally, many modifications may be made to adapt a particular situation to the teachings of the present invention without departing from the central inventive concept described herein. Furthermore, embodiments of the present invention may not include all of the features described above. Therefore, it is intended that the present invention not be limited to the particular embodiments disclosed, but that the invention include all embodiments falling within the scope of the appended claims.

What is claimed is:

1. A differential amplifier, the differential amplifier comprising:
    a first supply voltage terminal;
    a second supply voltage terminal;
    a first branch comprising:
        a first load transistor, wherein the gate of the first load transistor comprises means for receiving a specified potential; and
        a first amplifier transistor, series connected to the first load transistor at a first connection point;
    a second branch comprising:
        a second load transistor, wherein the gate of the second load transistor comprises means for receiving the specified potential; and
        a second amplifier transistor, series connected to the second load transistor at a second connection point, wherein the second branch is parallel connected with the first branch between the first supply voltage terminal and a bias node;
a bias transistor coupled between the bias node and the second supply voltage terminal; and
a stabilizing circuit comprising:
at least one compensation transistor for stabilizing the potential at the first connection point; and
a dynamic bias circuit that supplies a biasing voltage to the gate of the compensation transistor.

2. A differential amplifier comprising:
a first supply voltage terminal;
a second supply voltage terminal;
a first branch comprising:
a first load transistor, wherein the gate of the first load transistor comprises means for receiving a specified potential; and
a first amplifier transistor, series connected to the first load transistor at a first connection point;
a second branch comprising:
a second load transistor, wherein the gate of the second load transistor comprises means for receiving the specified potential; and
a second amplifier transistor, series connected to the second load transistor at a second connection point,
wherein the second branch is parallel connected with the first branch between the first supply voltage terminal and a bias node;
a bias transistor coupled between the bias node and the second supply voltage terminal; and
a stabilizing circuit for stabilizing the potential at the first connection point,
wherein the stabilizing circuit includes a compensation transistor coupled between the bias node and the second supply voltage terminal, the gate of the compensation transistor being controlled by a dynamic bias circuit.

3. The differential amplifier of claim 2,
wherein the dynamic bias circuit includes:
a first transistor having a gate connected to the first connection point; and
a second transistor series-connected to the first transistor such that the series connection is coupled between the first voltage supply terminal and the second voltage supply terminal, and
the gate of the compensation transistor is connected to the connection point between the first and second transistors of the dynamic bias circuit.

4. The differential amplifier of claim 3, wherein each of the first and second amplifier transistors and the first transistor of the dynamic bias circuit have their source connected to their bulk.

5. A differential amplifier comprising:
a first supply voltage terminal;
a second supply voltage terminal;
a first branch comprising:
a first load transistor, wherein the gate of the first load transistor comprises means for receiving a specified potential; and
a first amplifier transistor, series connected to the first load transistor at a first connection point;
a second branch comprising:
a second load transistor, wherein the gate of the second load transistor comprises means for receiving the specified potential; and
a second amplifier transistor, series connected to the second load transistor at a second connection point,
wherein the second branch is parallel connected with the first branch between the first supply voltage terminal and a bias node;
a bias transistor coupled between the bias node and the second supply voltage terminal; and
a stabilizing circuit for stabilizing the potential at the first connection point,
wherein the stabilizing circuit includes:
a first compensation transistor coupled between the first supply voltage terminal and the first connection point; and
a second compensation transistor coupled between the first supply voltage terminal and the second connection point,
wherein the gate of the first compensation transistor and the gate of the second compensation transistor are controlled by a dynamic bias circuit.

6. The differential amplifier of claim 5,
wherein the dynamic bias circuit includes:
a first transistor having a gate connected to the first connection point; and
a second transistor series-connected to the first transistor such that the series connection is coupled between the first voltage supply terminal and the second voltage supply terminal, and
the gate of the first compensation transistor and the gate of the second compensation transistor are connected to the connection point between the first and second transistors of the dynamic bias circuit.

7. The differential amplifier of claim 6, wherein each of the first and second amplifier transistors and the first transistor of the dynamic bias circuit have their source connected to their bulk.

8. The differential amplifier of claim 1, wherein all of the transistors are metal-oxide semiconductor ("MOS") transistors.

9. The differential amplifier of claim 1, wherein the second connection point is the output of the amplifier.

10. The differential amplifier of claim 3,
wherein the gate of the bias transistor comprises means for receiving a bias potential, and
the gate of the second transistor of the dynamic bias circuit comprises means for receiving the bias potential.

11. The differential amplifier of claim 3, wherein the second transistor of the dynamic bias circuit is weakly conductive.

12. The differential amplifier of claim 2, wherein the compensation transistor is always biased to be conductive.

13. The differential amplifier of claim 5, wherein the compensation transistors are always biased to be conductive.

14. A differential amplifier comprising:
a first supply voltage terminal;
a second supply voltage terminal;
a first branch comprising:
a first load transistor, wherein the gate of the first load transistor comprises means for receiving a specified potential; and
a first amplifier transistor, series connected to the first load transistor at a first connection point;
a second branch comprising:
a second load transistor, wherein the gate of the second load transistor comprises means for receiving the specified potential; and a second amplifier transistor, series connected to the second load transistor at a second connection point, wherein the second branch is parallel connected with the first branch between the first supply voltage terminal and a bias node;

a bias transistor coupled between the bias node and the second supply voltage terminal; and a stabilizing circuit for stabilizing the potential at the first connection point, wherein the stabilizing circuit includes:

a first stabilizing transistor, the gate being connected to the connection point between the first load transistor and the first amplifier transistor;

a second stabilizing transistor, series connected to the first stabilizing transistor such that the series connection is coupled between the first supply voltage terminal and the second supply voltage terminal; and a third stabilizing transistor coupled between the bias node and the second supply voltage terminal, wherein the gate is connected to the connection point between the first stabilizing transistor and the second stabilizing transistor.

15. A circuit for the reading of a memory, comprising a differential amplifier according to claim 1.

16. A memory integrated circuit comprising a read circuit according to claim 15.

17. The memory integrated circuit of claim 16, wherein the memory integrated circuit is made by CMOS technology.

18. The differential amplifier of claim 1, wherein the dynamic bias circuit is coupled between the first and second supply voltage terminals, and is controlled by the potential at the first connection point.

19. A differential amplifier comprising:

a first supply voltage terminal;

a second supply voltage terminal;

a first branch comprising:
a first load transistor, wherein the gate of the first load transistor comprises means for receiving a specified potential; and
a first amplifier transistor, series connected to the first load transistor at a first connection point;

a second branch comprising:
a second load transistor, wherein the gate of the second load transistor comprises means for receiving the specified potential; and
a second amplifier transistor, series connected to the second load transistor at a second connection point,
wherein the second branch is parallel connected with the first branch between the first supply voltage terminal and a bias node;

a bias transistor coupled between the bias node and the second supply voltage terminal; and a stabilizing circuit for stabilizing the potential at the first connection point, wherein the stabilizing circuit includes at least one transistor that is coupled between the first and second supply voltage terminals, and that is not directly connected to the bias node.

20. A differential amplifier comprising:

a first supply voltage terminal;

a second supply voltage terminal;

a first branch comprising:
a first load transistor, wherein the gate of the first load transistor comprises means for receiving a specified potential; and
a first amplifier transistor, series connected to the first load transistor at a first connection point;

a second branch comprising:
a second load transistor, wherein the gate of the second load transistor comprises means for receiving the specified potential; and
a second amplifier transistor, series connected to the second load transistor at a second connection point,
wherein the second branch is parallel connected with the first branch between the first supply voltage terminal and a bias node;

a bias transistor coupled between the bias node and the second supply voltage terminal; and a stabilizing circuit for stabilizing the potential at the first connection point, wherein the stabilizing circuit includes at least one transistor that is coupled in parallel with the bias transistor between the bias node and the second supply voltage terminal.

21. A differential amplifier comprising:

a first supply voltage terminal;

a second supply voltage terminal;

a first branch comprising:
a first load transistor, wherein the gate of the first load transistor comprises means for receiving a specified potential; and
a first amplifier transistor, series connected to the first load transistor at a first connection point;

a second branch comprising:
a second load transistor, wherein the gate of the second load transistor comprises means for receiving the specified potential; and
a second amplifier transistor, series connected to the second load transistor at a second connection point,
wherein the second branch is parallel connected with the first branch between the first supply voltage terminal and a bias node;

a bias transistor coupled between the bias node and the second supply voltage terminal; and a stabilizing circuit for stabilizing the potential at the first connection point, wherein the stabilizing circuit includes at least one transistor that is coupled in parallel with the first load transistor between the first supply voltage terminal and the first connection point.

* * * * *